United States Patent [19]

Shipley

[11] Patent Number: 5,563,011
[45] Date of Patent: Oct. 8, 1996

[54] COLOR FILTER ASSEMBLY

[75] Inventor: Charles R. Shipley, Newton, Mass.

[73] Assignee: Shipley Company Inc., Marlborough, Mass.

[21] Appl. No.: 50,847

[22] Filed: Apr. 21, 1993

[51] Int. Cl.$^6$ ........................................ G03F 9/00
[52] U.S. Cl. .................. 430/7; 430/20; 430/270.1; 430/273.1; 430/321; 359/67; 359/68
[58] Field of Search ................... 430/7, 20, 273, 430/270, 321, 273.1, 270.1; 359/67, 68

[56] References Cited

U.S. PATENT DOCUMENTS

| | | | |
|---|---|---|---|
| 5,045,418 | 9/1991 | Fukuyoshi | 430/7 |
| 5,079,214 | 1/1992 | Long et al. | 430/7 |
| 5,166,125 | 11/1992 | Harrison et al. | 430/7 |
| 5,236,793 | 8/1993 | Nishiwaki et al. | 430/7 |

FOREIGN PATENT DOCUMENTS

| | | | |
|---|---|---|---|
| 0483693A2 | 5/1992 | European Pat. Off. | |
| 2-120366 | 5/1990 | Japan | 430/966 |
| 5-34920 | 2/1993 | Japan | 430/273 |
| 5-70735 | 3/1993 | Japan | |

OTHER PUBLICATIONS

Patent & Trademark Office English–Language Translation of Japanese Patent Application 5-70735 (Pub. Mar. 23, 1993).

*Primary Examiner*—Janis L. Dote
*Attorney, Agent, or Firm*—Robert L. Goldberg

[57] ABSTRACT

A color filter assembly comprising a topcoat layer which comprises a composition, wherein the composition in general comprises a crosslinking agent and a reactive resin binder, i.e., a resin that can undergo self-condensation and/or crosslinking with one or more other components of the composition upon thermal treatment or other activation. Preferred resin binders include those resins that contain pendant polar functional groups, particularly acidic moieties such as carboxyl (COOH) and/or hydroxyl (OH). Acrylic resins containing such groups are particularly preferred. Compositions of the invention exhibit low thickness loss and have exceptional light transmission properties. Compositions of the invention are also useful as carriers for pigments and dyes for forming color filter elements.

15 Claims, 2 Drawing Sheets

COLOR FILTER ASSEMBLY

BACKGROUND OF THE INVENTION

1. Introduction

The present invention relates to coating compositions that are particularly suitable for use as topcoats for flat panel displays such as a liquid crystal display, and processes and articles of manufacture that comprise such compositions.

2. Background Art

Liquid crystal display devices are known for digital display in electronic calculators, clocks, household appliances, audio equipment, etc. Liquid crystal displays are being developed to supplement cathode ray tube technology for display terminals. Liquid crystal displays occupy a smaller volume than cathode ray tube devices with the same screen area. In addition, liquid crystal display devices usually have lower power requirements than corresponding cathode ray tube devices.

There has been a need to incorporate a color display capability into such monochrome display devices, particularly in such applications as peripheral terminals using various kinds of equipment involving phototube display, mounted electronic display, or TV-image display. Various attempts have been made to incorporate a color display using a color filter array element into these devices.

Color filters are produced using a number of different methods, including those incorporating dyes such as the dyed gelatin or the dyed polyimide methods. While these methods have very good color purity, they have limited thermostability, and have only fair resistance to UV light and chemicals. In addition, these methods are complicated and costly in that they require multiple dying steps in dyed gelatin method and multiple photoresist applications and etching for uncured polyimide in the polyimide method.

Newer lithographic techniques incorporate pigment dispersed in photosensitized acrylics. Using these new techniques, no multiple dying or photoresist masking steps are required. In addition, thermal, light and chemical resistance are enhanced. However, only average color quality is achieved since the final elements are composed of suspended pigments, as compared to superior saturated dyed elements.

In the above methods of color filter fabrication a topcoat is applied to protect the underlying color filter elements from, for example, moisture or chemicals. Additionally, the topcoat planarizes for better cell gap uniformity. The topcoat has traditionally been a single overcoat of polyimide or acrylic. While these materials have marginally acceptable light transmittance, these coatings can have a thickness loss or shrinkage of about 50% when heated to normal processing temperatures. Such thickness loss is undesirable in that planarization of the substrate may be affected, and that more material must be used. Moreover, thickness loss is an indicator of inherent instability of the system and implies that the coatings may not be resistant to degradation over time.

In addition, current industry demands call for photoimageable topcoats that allow the border of the panel to remain clear. Having a clear edge allows for placement of drivers in these areas thus allowing manufacturers to reduce overall modular size.

It thus would be desirable to have new topcoat compositions. It would be further desirable to have new topcoat and color filter compositions, including photoimageable compositions, suitable for manufacture of flat panel displays and other articles.

SUMMARY OF THE INVENTION

The present invention provides novel coating compositions that are particularly suitable for use as topcoats as well as dye and/or pigment carriers of color filter elements for flat panel displays such as a liquid crystal display. It has been quite unexpectedly found that cured coating layers of many compositions of the invention exhibit low thickness loss and have exceptional optical transmission properties. In addition, the cured compositions of the invention have been found to exhibit excellent hardness and resistance to a wide array of chemicals used in processing.

A composition of the invention in general comprises a crosslinking agent and a reactive resin binder, i.e., a resin that can undergo crosslinking with one or more other components of the composition upon thermal treatment or other activation. The components of the invention can be non-photoimagable or photoimagable, wherein the composition will further contain a photoactive component, typically a photoacid or photobase generator. For non-photoimagable compositions, preferred resin binders include reactive moities that can crosslink with the crosslinker component. Specifically, preferred binders are hydroxyl-containing materials such as acrylic polymers, vinyl polymers other than acrylic polymers, polyesters and polyimides. For photoimagable compositions, resin binders that also have acidic groups, e.g., carboxylic acid groups, substitutions are particularly preferred. Use of such resins facilitate development with aqueous alkaline developer solutions. Acrylic resins containing such groups are particularly preferred.

The compositions of the invention are typically used as a cured, i.e. crosslinked, coating. Curing of the compositions may be induced solely by thermal treatment of the resin binder and crosslinker components. Alternatively, curing of the compositions of the invention may be promoted by acid or base, typically in addition to thermal treatment. In this embodiment, the compositions of the invention further comprise an acid generator or base generator compound, to catalyze or otherwise promote reaction among the composition components. Use of such additional composition components generally enables the curing reaction to proceed at relatively lower temperatures. As used herein, the term acid generator refers to a compound that generates an acid upon appropriate treatment of the compound, e.g., upon exposure of the acid generator to activating radiation (a photoacid generator), or upon thermal treatment (a thermal acid generator). Similarly, the term base generator refers to a compound that generates a base upon appropriate treatment of the compound, e.g., upon exposure of the base generator to activating radiation (a photobase generator), or upon thermal treatment (a thermal base generator). Prior to such activation, the acid and base generator compounds are typically substantially neutral materials. The compositions of the invention may further comprise one or more dyes or pigments and may be used for the manufacture of a colored liquid crystal display.

Further provided are methods for use of the compositions of the invention including methods for the manufacture of a liquid crystal display and other flat panel displays. Still further provided are novel articles of manufacture comprising a substrate coated with a layer of the composition of the invention. In particular, a liquid crystal display is provided that contains a cured coating layer of a composition of the invention as a topcoat layer. Other aspects of the invention are disclosed herein.

DETAILED DESCRIPTION OF THE INVENTION

Figure 1:
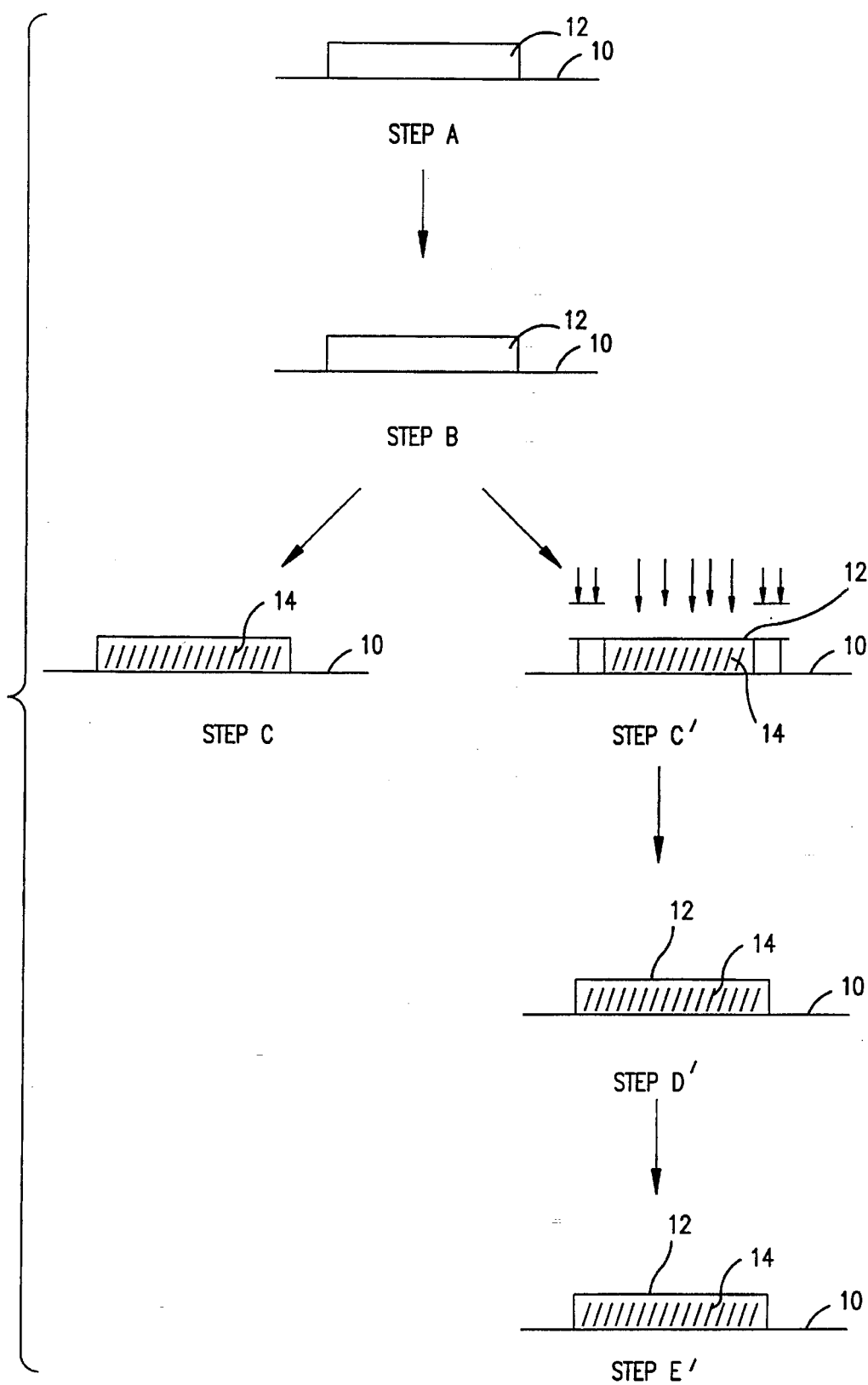
FIG. 1 illustrates schematically processes of the invention.

A composition of the invention in general comprises a crosslinking agent and a reactive resin binder, i.e., a resin that can undergo crosslinking with one or more other components of the composition upon thermal treatment or other activation. The components of the invention can be non-photoimagable or photoimagable. Photoimagable compositions will further contain a photoactive component, typically a photoacid or photobase generator. For non-photoimagable compositions, preferred resin binders include reactive moities that can crosslink with the crosslinker component. Specifically, preferred binders are hydroxyl-containing materials such as acrylic polymers, vinyl polymers other than acrylic polymers, polyesters and polyimides. For photoimagable compositions, resin binders that have acidic groups, e.g., carboxylic acid groups, substitutions are particularly preferred. Use of such resins facilitates development with aqueous alkaline developer solutions. Acrylic resins containing such groups are particularly preferred.

Suitable resin binders having acidic and OH group substitution include, e.g., acrylic polymers, vinyl polymers other than acrylic polymers, polyesters and polyimides. Acrylic polymers are generally preferred. These binders are suitably prepared from polymerization of one or more monomers or oligomers that comprise free acid groups, particularly unsaturated monomers that contain at least one free OH or carboxylic acid group.

The preferred acrylic resin binders having acidic group substitution can be prepared by the polymerization or copolymerization of acrylic acid, methacrylic acid, the esters or amides thereof, and mixtures of such monomers, provided that at least one monomer can polymerize and provide an acid group pendant from the resultant polymers. More particularly, a suitable acrylic polymer, (meth)acrylic acid polymer bearing acidic polar groups may be prepared from acrylic acid or methacrylic acid monomers alone or with other monomers such as aryl containing monomers, e.g., aryl monomers having a source of unsaturation such as a pendent vinyl group and 6 or 10 aromatic carbon atoms, preferably 6 carbon atoms, or other monomers such as lower alkyl acrylic or methacrylic acid esters where the alkyl groups contained from 1 to about 8 carbon atoms, for example, methyl methacrylate, butylacrylate and the like. Alternatively, it is also possible to modify polymers having no polar groups to include such groups. For example, a glycidal methacrylate polymer can be reacted with an acid to attach an acidic group to the polymer chain.

Vinyl polymers, other than the acrylic or methacrylic polymers described above, incorporating acidic groups may also be used. These polymers can be prepared by the polymerization of vinyl monomers such as styrene and substituted styrene, vinyl halides such as vinyl chloride, vinyl esters such as vinyl acetate, and vinyl ethers such as methyl vinyl ether, alone or with other vinyl monomers, provided that at least one of the monomers contains an acid group. Specifically preferred materials for use as the resin binder component include polystyrene maleic anhydride copolymers, polystyrene maleic acid ester copolymers and solid styrene maleic acid ester oligomer terminated with methylmethacrylate.

Epoxy polymers, polyesters and polyurethanes having acid group substitution are also useful in the photosensitive compositions of the invention, but are generally lesser preferred. Details for their formation are known to the art. See, e.g., U.S. Pat. No. 4,592,816.

Resin binders comprising pendent carboxylic acid groups as well as pendent amine groups are also suitable for use in the composition of the invention. Such resin binders are described in EPO Publication 539,714, incorporated herein by reference.

Another resin binder suitable for use in the composition of the invention comprises only pendent basic groups, preferably amine groups. Such resin binders are described, for example, in EPO Publication 490,118, incorporated herein by reference. Compositions comprising this resin binder as its sole resin binder should also comprise a crosslinker that comprises a source of unsaturation, such as an unsaturated monomer or oligomer.

The concentration of the resin component of the compositions of the invention may vary within relatively broad ranges, and in general the resin component is between about 10 and 60 or more weight percent of total solids of the compositions. As used herein, the term total solids of a composition refers to all components of a composition other than a solvent carrier.

The second component of the compositions of the invention is one or more materials capable of self-condensing and/or crosslinking with one or more components of the composition.

A preferred crosslinker is a compound containing an amine group such as a melamine monomer, oligomer or polymer, and various resins such as melamine-formaldehyde, benzoguanamine-formaldehyde, urea-formaldehyde and glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Specifically suitable amine-based crosslinkers include the melamines manufactured by American Cyanamid Company of Wayne, N.J. such as Cymel® 300, 301, 303, 350, 370, 380, 1116 and 1130; benzoguanamine resins such as Cymel® 1123 and 1125; the glycoluril resins Cymel® 1170, 1171 and 1172; and the urea-based resins such as Beetle® formaldehyde urea condensates 60, 65 and 80. A large number of similar amine-based compounds are commercially available from various suppliers.

Of the above amine-based crosslinkers, the melamines are preferred. Particularly preferred are melamine formaldehyde resins, i.e., reaction products of melamine and formaldehyde. These resins are typically ethers such as trialkylol melamine and hexaalkylol melamine. The alkyl group may have from 1 to as many as 8 or more carbon atoms but is preferably methyl. Depending upon the reaction conditions and the concentration of formaldehyde, the methyl ethers may react with each other to form more complex units.

It has been found that the compositions of the invention exhibit low thickness loss or shrinkage upon curing, While not wishing to be bound by theory, this is believed to result, at least in part, by use of an amine-based crosslinker.

Further preferred for photoimagable compositions of the invention is the use of a second crosslinker in addition to the above amine-based crosslinkers. Such additional crosslinkers comprise a source of unsaturation capable of undergoing crosslinking or polymerization upon exposure to activating radiation. More particularly, a preferred crosslinker is an unsaturated or polymerizable monomer or oligomer, e.g., a multifunctional unsaturated monomer having two or more unsaturated groups attached to the same molecule.

Particularly preferred of this group crosslinkers are multifunctional monomers having three or more acrylate or methacrylate groups attached to each monomer molecule. Still more are tri, tetra and penta multifunctional monomers. Multifunctional oligomers are also useful. An unsaturated monomer or oligomer is preferably added to a resist composition in a concentration sufficient to give a Bromine Number of about 35 or greater.

Specifically preferred crosslinkers for the compositions of the invention include multifunctional monomers such as allyl methacrylate; 1,4-benzenediol dimethacrylate; bisphenol-A diacrylate; 1,3-butanediol diacrylate; 1,4-butanediol diacrylate; butylene glycol dimethacrylate; 1,4-cyclohexanediol dimethacrylate; diethylene glycol diacrylate; di-(3-methacryloxy-ethyl) ether of bisphenol-A; di-(3-methacryloxy-2-hydroxypropyl) ether of 1,4 butanediol; dipropylene glycol dimethacrylate; ethylene glycol diacrylate; hexamethylene glycol dimethacrylate; melamine acrylate; 1-phenyl-1,2-ethanediol dimethacrylate; 1,3 propanediol diacrylate; 1,2-propanediol dimethacrylate; tetraethylene glycol diacrylate; tetraethylene glycol dimethacrylate; trimethylolethane triacrylate; tripropylene glycol diacrylate; and tris-(2-methacryloxyethyl) isocyanate. Additional examples of suitable multifunctional monomers can be found in the U.S. Pat. No. 4,592,816.

A compound that contains one or more electrophilic multiple bonds is a suitable crosslinker particularly for compositions that comprise a base or base generator compound. Examples of electrophilic multiple bonds include maleimides, alpha,beta-unsaturated ketones, esters, amides, nitriles and other alpha,beta-unsaturated electron-withdrawing groups. Typically the electrophilic multiple bond will be a carbon-carbon double bond activated by one or more electron-withdrawing substituents, although activated acetylenes can also function as the electrophilic species. Preferred is a crosslinker that comprises two or more electrophilic multiple bonds. Particularly preferred are those active groups that comprise a carbon-carbon multiple bond that is stabilized by two electron-withdrawing substituents such as malonate esters or beta-keto esters or, preferably, maleimide groups. These Michael acceptors will undergo a base-initiated reaction with a suitable nucleophile. For example, in the compositions of the invention, the above described phenolic resin binders, and/or the photoactivated base can undergo addition with these crosslinker materials that contain an electrophilic multiple bond.

Particularly suitable crosslinking materials that contain an electrophilic multiple bond include a crosslinker that contains one or more maleimide groups, and specifically preferred are bismaleimides of the following formula (III):

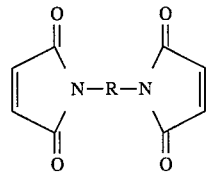

wherein R is selected from the group consisting of substituted or unsubstituted aryl, substituted or unsubstituted alkyl, or a group of the formula $R^1$—Ar—$R^2$—Ar'—$R^3$, where $R^1$, $R^2$ and $R^3$ are independently selected from the group consisting of a substituted or unsubstituted alkyl, and Ar and Ar' are each independently selected from the group consisting of substituted or unsubstituted aryl. Said substituted aryl and alkyl groups of the compounds of formula (III) are suitably substituted by one or more functionalities such as, for example, halogen, alkoxy (such as methoxy, ethoxy, etc.), aryl and alkyl. Said substituted and unsubstituted alkyl groups of formula (III) preferably have from 1 to 8 carbon atoms, more preferably 1 to 4 carbon atoms. Aryl groups are preferably phenyl. A specifically preferred compound of formula (III) is 1,1'-(methylenedi-1,4-phenylene)bismaleimide.

A number of suitable maleimides, including bismaleimides of formula (III) are commercially available. For example, suitable maleimides are available from Kennedy and Klim, Inc. of Little Silver, N.J. Other suitable maleimides can be readily synthesized by known procedures, for example by thermal or acidic condensation of maleic anhydride with a compound of a structure corresponding to $R(NH_2)_2$, where R is as defined above in reference to formula (I). See, I. Varma, et al., *Polymer News,* 12:294–306 (1987), incorporated herein by reference.

Resins that contain electrophilic multiple bonds, or that contain both epoxy and electrophilic multiple bonds, also can be suitably employed as the crosslinking material in the compositions of the invention. Many suitable resins are commercially available, such as the bismaleimide resins available under the tradename Kerimid by Rhone-Poulenc, and Thermax MB-8000 available from Kennedy and Klim, Inc. Suitable maleimide resins are also described in the above incorporated article of I. Varma, et al., and in U.S. Pat. No. 4,987,264, incorporated herein by reference.

The concentration of the one or more crosslinkers in a composition may vary within a relatively wide range. As will be appreciated to those skilled in the art, suitable concentrations will vary with factors such as crosslinker reactivity and specific application of the composition. In general, a suitable concentration of one or more crosslinkers is about 2 to 30 weight percent of total solids of the composition, preferably about 2 to 20 weight percent of total solids. While compositions of the invention may include such unsaturated materials and other crosslinkers, for preferred aspects of the invention, a composition is employed that substantially, essentially or completely free of unsaturated monomers and/or oligomer crosslinkers as described above. That is, in such preferred aspects of the invention, the crosslinker component consists at least substantially or essentially only of the above amine based crosslinkers. More preferred are those compositions where one crosslinker components consists at least substantially or essentially only of a melamine crosslinker such as a melamine formaldehyde resin.

If desired, the compositions of the invention may further comprise a radiation sensitive component. The radiation sensitive component will typically be an additional material in the composition, although the present invention includes compositions where the radiation sensitive component in an integral part of another component of the composition, for example a resin binder that comprises pendant photoactive groups, or a binder that comprises a photoactive group as a unit of the polymer chain.

The radiation sensitive component is preferably selected from the group consisting of a compound that is capable of generating acid upon exposure to activating radiation (i.e., an acid generator) and a compound capable of generating base upon exposure to activating radiation (i.e., a base generator compound).

A generally preferred photoacid generator is the onium salts, preferably those with weakly nucleophilic anions. Such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and b, Ia and b and I of the Periodic Table, for example, halonium salts, particularly aromatic iodonium and iodoxonium salts, quaternary ammonium, phosphonium and arsonium salts, aromatic sulfonium salts and sulfoxonium salts or selenonium salts. Examples of suitable onium salts can be found in U.S. Pat. Nos. 4,442,197; 4,603,101; and 4,624,912, all incorporated herein by reference.

Another suitable group of acid generating compounds are the iodonium salts. A preferred group of such salts are those resulting from the aryliodosotosylates and aryl ketones as disclosed, for example, in U.S. Pat. No. 4,683,317, incorporated herein by reference.

Of the acid generators, at least some non-ionic organic compounds should be suitable. Preferred non-ionic organic acid generators include halogenated non-ionic compounds such as, for example, 1,1-bis[p-chlorophenyl]-2,2,2-trichloroethane (DDT); 1,1-bis[p-methoxyphenyl]- 2,2,2-trichloroethane (methoxychlor®); 1,2,5,6,9,10-hexabromocyclododecane; 1,10-dibromodecane; 1,1-bis[p-chlorophenyl] 2,2-dichloroethane; 4,4'-dichloro-2-(trichloromethyl)benzhydrol, 1,1-bis(chlorophenyl)2-2,2-trichloroethanol (Kelthane®); hexachlorodimethylsulfone; 2-chloro-6-(trichloromethyl)pyridine; 0,0-diethyl-0-(3,5,6-trichloro-2-pyridyl)phosphorothioate (Dursban®); 1,2,3,4, 5,6-hexachlorocyclohexane; N(1,1-bis[p-chlorophenyl]-2,2, 2-trichloroethylacetamide, tris[2,3-dibromopropyl] isocyanurate; 2,2-bis[p-chlorophenyl]-1,1-dichloroethylene; and their isomers, analogs, homologs and residual compounds. Of the above, tris[2,3-dibromopropyl] isocyanurate is particularly preferred. Suitable acid generators are also disclosed in European Published Patent Application No. 0232972, incorporated herein by reference. The term residual compounds as used above is intended to include closely related impurities or other modifications of the above halogenated organic compounds which result during their synthesis and which may be present in minor amounts in commercial products containing a major amount of the above compounds.

Suitable photobase generator compounds photodecompose (e.g., undergo photocleavage) upon exposure to activating radiation to provide a base. A base generator suitably will be a neutral and non-ionic compound that generates base (e.g., an organic base such as an amine) upon photoactivation. It is believed that a variety of base generator compounds will be suitable for use in the compositions of the invention. Suitable base generators include organic compounds, for example, photoactive carbamates including benzyl carbamates and benzoin carbamates. Other suitable organic base generators include 0-carbamoylhydroxylamines, 0-carbamoyloximes, aromatic sulfonamides, alpha-lactones, amides such N-(2-arylethyenyl)amides, and amides. More specifically, suitable 0-carbamoylhydroxylamines include compounds of the formula $RR^1OC(=O)NR^2R^3$ where R and $R^1$ are independently alkyl, aryl or acyl, $R^2$ is hydrogen or alkyl and $R^3$ is alkyl or aryl. Suitable 0-carbamoyloximes include compounds of the formula $RR^1C(=N)OC(=O)NR^2R^3$ where R and $R^1$ are independently hydrogen, alkyl or aryl, $R^2$ is alkyl or aryl and $R^3$ is hydrogen or alkyl. Suitable sulfonamides include compounds of the formula $ArS(=O)_2NRR^1$ where Ar is an aryl group, R is hydrogen or alkyl and $R^1$ is alkyl or aryl. Suitable alpha-lactams include compounds of the formula (II):

where R is alkyl or aryl and $R^1$ is alkyl or aryl. Suitable N-(2-arylethyenyl)amides include compounds of the structure $RC(=O)N(R^1)CH=CHAr$ where Ar is an aryl group, R is alkyl or aryl and $R^1$ is alkyl. Other amides also will be suitable, for example, formanilide and other aryl substituted amides. In the above described formulas, aryl is typically phenyl. As referred to in the above formulas, an alkyl group may be of a straight chain or branched configuration, or comprise a cyclic structure, and typically contains from 1 to 15 carbon atoms, more typically from 1 to 6 carbon atoms. An alkyl group is suitably either unsubstituted or substituted at one or more available positions. The substituents may be, for example, halo, aryl, or alkyl. Similarly, an aryl group also may be unsubstituted or substituted at one or more available positions by, for example, halo, aryl or alkyl.

Specifically preferred organic base generators include 2-hydroxy-2-phenylacetophenone N-cyclohexyl carbamate [i.e., $(C_6H_5C(=O)CH(C_6H_5)$ $OC(=O)NH$ $C_6H_{11}$], o-nitrobenzyl N-cyclohexyl carbamate [i.e., o-$NO_2C_6H_5CH_2OC(=O)NHC_6H_{11}$], N-cyclohexyl-2-naphthalene sulfonamide [i.e., $C_{10}H_7SO_2NHC_6H_{11}$], 3,5-dimethoxybenzyl N-cyclohexyl carbamate [i.e., $(CH_3O)_2C_6H_5CH_2OC(=O)NHC_6H_{11}$], N-cyclohexyl p-toluene sulfonamide [i.e., p-$CH_3C_6H_5SO_2NHC_6H_{11}$], and dibenzoin isophorone dicarbamate.

Metal coordination complexes that generate base upon exposure to activating radiation also will be suitable, such as the cobalt (III) complexes described in J. Coatings Tech., 62(786):63–67 (July 1990), incorporated herein by reference. The described photoactive materials include compounds of the formula $Co(NH_2R)_5X^{n+}$ where R is hydrogen, methyl or n-propyl, X is $Cl^-$, $Br^-$, $I^-$ or other uninegative groups when n= 2; and X is $RNH_2$ or $H_2O$ when n= 3, and a suitable counter ion chosen to impart the desired solubility. Suitable counter ions include, for example $Cl^-$, $Br^-$ or $ClO_4^-$. Additionally, other metal coordination complexes that generate base upon exposure to activating radiation will be suitable photobase generators for use in the compositions of the invention.

Preparation of photobase generator compounds is known in the art. For example, suitable benzyl carbamates can be prepared by the reaction of a diisocyanate with a benzyl alcohol in the presence of a suitable catalyst. Thus dibenzoin isophorone dicarbamate is prepared by reaction of benzoin with isophorone diisocyanate in a suitable solvent, typically with heating, and in the presence of a suitable catalyst such as methyllithium. Suitable solvents include ether and tetrahydrofuran. Photoactivation of this base generator provides isophoronediamine. See J. Cameron et al., *J. Am. Chem. Soc.*, 113(11): 4303–4313 (1991); J. Cameron et al., *J. Polym. Mater. Sci. Eng.*, 64:55 (1991); and J. Cameron, et al., *J. Org. Chem.*, 55:5919–5922 (1990), all of which are incorporated herein by reference for their teaching of preparation of photobase generators. Ortho-nitrobenzyl N-cyclohexyl-carbamate can be prepared by reaction of cyclohexylisocyanate and 2-nitrobenzyl alcohol in a heated toluene solution until reaction completion. Thin layer chromatography can be employed to monitor progress of the reaction. Suitable reaction temperatures include temperatures at or about 110° C. See European Patent Application 0425 142 A2, publication date Feb. 5, 1991, incorporated herein by reference for its teaching of photobase generators and the preparation thereof. The synthesis of sulfonamides is well known and generally involves reaction of a sulfonyl chloride with an amine. Thus N-cyclohexyl p-toluene sulfonamide is prepared by reaction of p-toluenesulfonyl chloride and cyclohexyl amine in a suitable solvent with heating. Suitable solvents include for example tetrahydrofuran and toluene. A photoactive polymer may also be prepared and used in the compositions of the invention as the photobase generator component. For example, a polymer containing pendant photoactive carbamate groups can be employed. Such a polymer can be prepared by adding a tetrahydrofuran solution of a catalytic amount of 4-dimethylaminopyridine and triethylamine to a mixture of o-nitrobenzyloxycarbonyl chloride and p-aminostyrene. Upon reaction completion, the reaction product can be purified by standard means, for example flash column chromatography, to yield the o-nitrobenzyloxycarbonyl carbamate of p-aminostyrene. Other polymers will undergo similar reaction with a benzyl carbonyl chloride, for example copolymers such as poly(p-aminostyrene-co-styrene) and poly(p-aminostyrene-com-ethyl methacrylate).

A photoacid or photobase generator should be present in a composition of the invention in an amount sufficient to enable development of a coating layer of the composition following exposure of the same to activating radiation and a post-exposure bake, if needed. More specifically, a photoacid generator or photobase generator is typically employed in a composition in a concentration of from about 1 to 15 weight percent of total solids of the composition, more typically from about 1 to 6 weight percent of total solids of the composition, although it should be clear that suitable concentrations of the photoactive component can vary with the particular agent that is employed. For a composition containing a photoacid generator, a coating layer of the composition is exposed to an effective amount of activating radiation to generate the photoacid, followed by a post-exposure bake at a temperature sufficient to at least partially cure the coating layer.

The compositions of the invention may further comprise an acid or base generator compound for catalyzing the crosslinking reaction between the resin binder and crosslinker compound and thus allowing the reaction to proceed at a lower temperature. Preferably an acid generator compound is employed. Suitable acid generator compounds include compounds that liberate acid upon photolysis or thermal treatment. Preferably a thermal acid generator is employed, i.e., a compound that generates acid upon thermal treatment. A variety of known thermal acid generator compounds are suitably employed in the compositions of the invention such as, for example, 2,4,4,6-tetrabromocyclohexadienone, benzoin tosylate, 2-nitrobenzyl tosylate, and alkyl esters of organic sulfonic acids. Typically a thermal acid generator is present in a composition in concentration of from about 1 to 15 percent by weight of the total of the dry components of the composition, more preferably about 5 percent by weight of the total dry components.

It should be appreciated that a composition of the invention can be non-photoimageable, e.g., by not employing any catalyst or employing a non-photoactive catalyst such as thermal acid generator or a thermal base generator; or a composition can be rendered photoimageable (and hence developable) by incorporating an effective amount of a suitable photoacid generator into the composition and then exposing a coating layer of the composition through a photomask. Suitable photoacid generators include the non-ionic halogenated photoacid generators as described herein.

If desired, the dyes or pigments may be included in the compositions of the invention. Such dyes or pigments can include any color, for example, red, green and blue. A suitable blue dye is Orasol Blue available from Ciba-Geigy. The colored composition of the invention can be used in the manufacture of LCD color filter arrays.

Fillers and dyes which may be present in large concentration such as, for example, in amounts of from 5 to 50 percent by weight of the total of the composition's solid components. Other optional additives such as wetting agents, gas release agents, levelling agents, etc. typically will be present in relatively low concentrations, for example less than about three weight percent of total solids of the composition.

To make a liquid coating composition, the components of the composition are dissolved in a suitable solvent such as, for example, one or more of the glycol ethers such as ethylene glycol monomethyl ether, propylene glycol monomethyl ether, dipropylene glycol monomethyl ether; esters such as a methyl cellosolve acetate, ethyl cellosolve acetate, propylene glycol monomethyl ether acetate, dipropylene glycol monomethyl ether acetate and other solvents such as dibasic esters, propylene carbonate, gamma-butyro lactone and alcohols such as n-propanol.

The dry components are dissolved in a solvent to form a liquid coating composition. The solids concentration will depend on several factors such as the method of application to a substrate. In general, the concentration of the solids in the solvent may vary from about 10 to 70 or more weight percent of the total weight of the coating composition. More specifically in the case of a curtain coating composition, the solids content may be in the range of between about 40 to 50 or more weight percent of the total weight of the composition. The compositions of the invention may also be used to form a dry film laminate as is known in the art. See, W. Deforest, *Photoresist Materials and Processes*, pp. 163–212 (McGraw Hill 1975), incorporated herein by reference.

Reference is now made to the FIG. 1 of the drawing which shows preferred method for use of a topcoat composition of the invention. In step A, a topcoat composition is applied to substrate 10 to provide topcoat coating layer 12. The topcoat composition may be applied by virtually any standard means including spin coating. The composition in general is applied on a substrate with a dried layer thickness of between 0.5 and 4 µm preferably a dried thickness of between 1 and 2 µm. The substrate is suitably any substrate particularly a flat panel display such as a liquid crystal display, as discussed more fully in FIG. 2 below. Substrates for flat panel display applications, including liquid crystal display applications include glass substrates, indium-tin oxide (ITO) coated substrates and the like.

In step B, the topcoat composition is dried of solvent by heating. Drying conditions will vary with the components of the composition. If a non-imagable formulation is used, a final bake curing step C may be employed in temperatures of about 50° C. to 300° C. for 1 to 60 minutes, using an convection oven bake or 30 seconds to 5 minutes using a vacuum hotplate bake provide a crosslinked coating 14. The curing step may be combined with drying step B.

Additionally, if the composition includes a photoactive component, e.g., a photoacid or photobase generator, the coating layer can be at least partially cured by exposing the coating layer to an effective amount of activating radiation (e.g., between about 10 to 300 mJ/cm$^2$). Steps C' through E' of the drawings depicts such embodiment of the invention, i.e., where the composition contains a photoacid component and it is imaged with activating radiation. Optimally, exposure may be followed by a post-exposure bake from about 50° C. to 140° C. Typical exposure would be patterned or could also have a flood type exposure to generate acid or base throughout the coating to enable lower cure temperatures in subsequent process steps. In step C', coating layer 12 is imaged with activating radiation through a mask in a conventional manner. The exposure is sufficient to effectively activate the photoactive component of the radiation sensitive system to produce a patterned image 14 in coating 12. As discussed above and shown in the Figure, this method can be used where a clear border is desired on a flat panel display.

In step D', the exposed coating layer 12 is developed, preferably with an aqueous base developer such as tetramethylammonium hydroxide. Other useful developers include sodium hydroxide, potassium hydroxide, sodium carbonate, sodium bicarbonate, sodium silicate, aqueous ammonia or the like. This step will remove unexposed, non-crosslinked areas, e.g., border areas along the flat panel substrate.

Following development, a final bake curing step E' may be employed in temperatures of about 50° C. to 300° C. to further cure the developed exposed areas 14.

Figure 2:
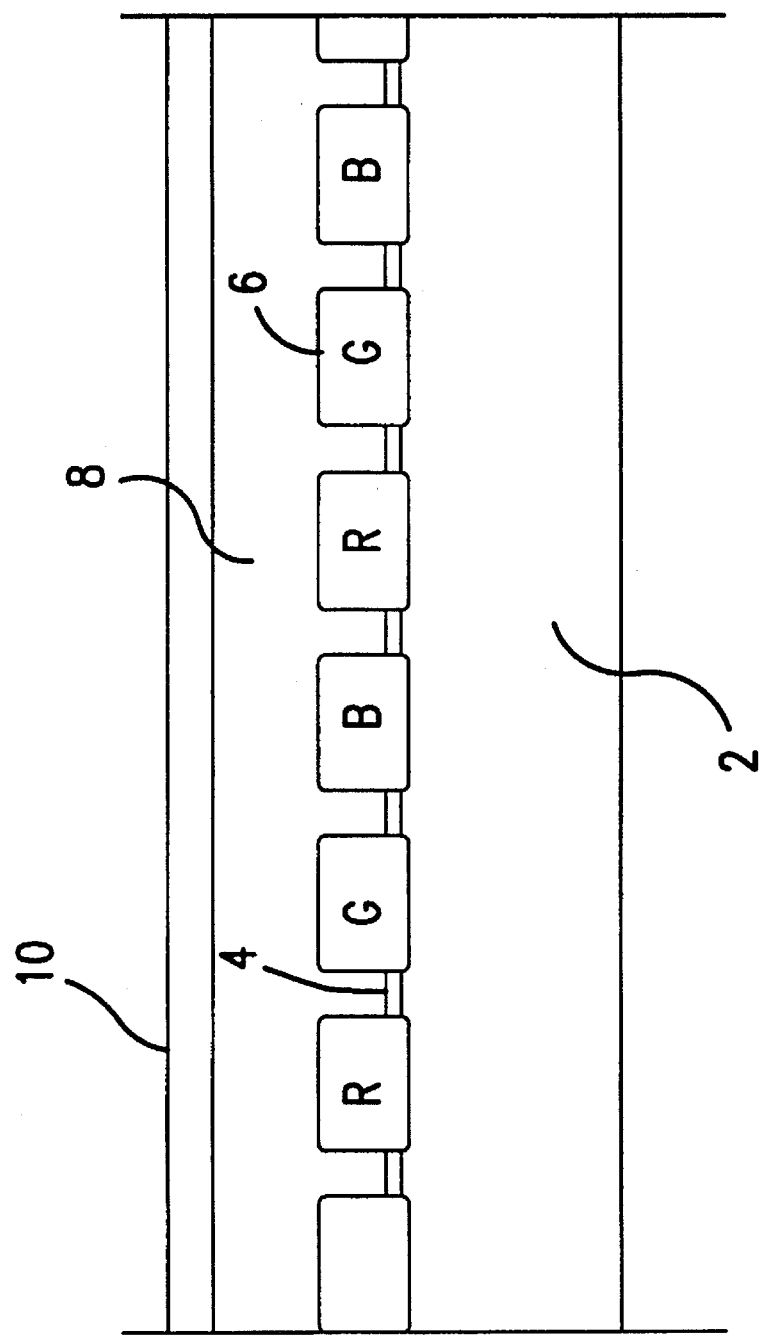
FIG. 2 illustrates the structure of an LCD color filter assembly.

Preferably, these compositions are used on a flat panel display device, particularly a color liquid crystal display. As shown in FIG. 2, a color filter assembly of a color LCD is comprised of a transparent substrate 2, preferably glass, a black matrix layer 4, a color filter array 6, e.g., red, green and blue areas, a topcoat layer 8 and a transparent electrode 10, such as ITO.

As discussed above, low thickness loss and enhanced light transmission properties are critical for many applications including flat panel display topcoats; nevertheless, many commercially available polyimide and acrylic topcoats do not exhibit satisfactory properties. In contrast to such prior topcoats, the compositions of the invention exhibit exceptional light transmittance and low thickness loss. Specifically, when cured compositions of the invention were subjected to a bake in air at 250° C. for 60 minutes, the composition exhibited over 99% transmittance at 400 and 550 nm and about a 12% thickness loss. Preferred cured compositions of the invention exhibit a thickness loss of less than 50% and have greater than 95% optical transmittance. In addition, compositions of the invention have been found to be chemically resistant to aqueous solutions of NaOH, KOH, HCl, H$_2$SO$_4$, undiluted NMP (1-methyl-2-pyrrolidinone) and H$_2$O. Moreover, the compositions of the invention have been shown to exhibit excellent hardness greater than 6 H, using the standard pencil test.

The following non-limiting Examples are illustrative of the invention.

Throughout the examples, the following designation represent the following materials: MAA is methacrylic acid; HEMA is hydroxyethyl methacrylate; MIMA is methyl methacrylate; and BA is butyl acrylate.

EXAMPLES 1–6

Six different compositions of the invention were prepared by administering the components in the amounts specified in the Table below. Each of the resin binders was a polyacrylate formed by free radical polymerization of the specified monomer mixture with amounts expressed as parts by weight.

Without wishing to be bound by theory, it is believed that the benefit is obtained in all instances where MAA and/or HEMA is in the polymer composition.

| Example No. | Resin Binder Composition % | | | | Cross-linker[1] | Thickness Loss |
|---|---|---|---|---|---|---|
| | MAA | HEMA | MMA | BA | | |
| 1 | 5 | 30 | 34 | 31 | Yes | 23% |
| 2 | 10 | 9 | 44 | 37 | Yes | 23% |
| 3 | 9 | 3 | 87 | 1 | Yes | 17% |
| 4 | 6 | 28 | 65 | 1 | Yes | 24% |
| 5 | 12 | 3 | 84 | 1 | Yes | 13% |
| 6 | 10 | 9 | 80 | 1 | Yes | 12% |

[1] A melamine-formaldehyde resin (Cymel 300)

Coating layers of each of the above compositions were applied on glass substrates by means of spin coating. The dry film thicknesses of the coating layers were typically in the range of 2.5 to 3 microns. The dried films were cured for 30 minutes at 140° C. in an air-recirculating oven. Subsequently, the parts were baked at 250° C. for 60 minutes. Thicknesses were measured after initial application and after curing using a Nanospec instrument. Refractive indexes (required for the Nanospec measurement) were determined for all films using a Metricon PC-2000 prism coupler. The curing step usually is not needed if parts are subsequently baked at temperatures above 140° C.

Light Transmittance

Light transmittance results after 30 minutes bakes at 250° C. and 260° C. for Examples 1 and 2 compositions were close to 100% at 400 and 550 nm. Example 3 retains about 96% light transmittance at 400 and 550 nm after a 30 minute bake at 280° C.

EXAMPLES 7–11

Various amino crosslinking agents are useful, including melamines, benzoguanidine, Cymel 1170. Unexpectedly, these agents have only a minimal adverse effect on light transmittance.

In these Examples, the polymer: crosslinker ratio was 4:1 on a weight-to-weight basis.

| Example No. | Resin Binder Composition % | | | | Cross-linker | Thickness Loss[1] |
|---|---|---|---|---|---|---|
| | MAA | HEMA | MMA | BA | | |
| 7 | 5 | 30 | 34 | 31 | Cymel 1170 | 23% |
| 8 | 10 | 9 | 44 | 37 | Cymel 303 | 24% |
| 9 | 10 | 9 | 44 | 37 | Cymel 300 | 27% |
| 10 | 10 | 9 | 44 | 37 | Cymel 1123 | 23% |
| 11 | 10 | 9 | 44 | 37 | Beetle | 31% |

[1] (Measured as in Examples 1–6)

In this Example, the photoacid generator triarlysulfonium hexafluoroantimonate was added to a composition consisting of a resin binder of 10% by weight MAA, 9% by weight HEMA, 80% by weight MMA and 1% by weight BA and a melamine formaldehyde resin (Cymel 300) crosslinker. The photoacid generator was used in an amount of 5% photoacid generator to 95% by weight of the remaining solids in the composition. The composition is photoimaged using propylene glycol methyl ether solvent as the developer. The photoexposed image had a relatively minor thickness loss after baking for 60 minutes at 250° C. in an air atmosphere. The procedure for determining thickness loss was the same procedure used in Examples 1–6.

EXAMPLE 12

1 gram of blue dye (Orasol Blue GN) was dissolved in 100 grams of the following photoimageable composition:

|  | Resin Binder Composition | | | | |
| --- | --- | --- | --- | --- | --- |
|  | MAA | HEMA | MMA | BA | Grams |
| Acrylic Polymer | 10% | 9% | 44% | 37% | 18 |
| Melamine (CYMEL 303) |  |  |  |  | 4.5 |
| Photoacid generator |  |  |  |  | 3 |
| Propylene Glycol Methyl Ether |  |  |  |  | 74.5 |

The photoacid generator of the composition was triaryl sulfonium hexafluoroantimonate. The composition was applied to a glass substrate. After 250° C. postbake, the thickness loss was about 25%. The blue dye retained its color and was not visually degraded. The clear photoimageable composition has an equivalent thickness loss.

EXAMPLE 13

The blue dyed composition of Example 12 was photoimaged. Then a clear color filter topcoat (composition of Example 2) was applied by spincoating and subsequently cured. The coating adhered to the underlying blue color filter material, and did not attack nor degrade the underlying material. After baking for 60 minutes at 250° C., the blue color was not adversely affected.

The foregoing description of the invention is merely illustrative thereof, and it is understood that variations and modifications can be make without departing from the scope or spirit of the invention as set forth in the following claims.

What is claimed is:

1. A color filter assembly comprising a transparent substrate having thereon a black matrix layer, a color filter array, a topcoat layer and a transparent electrode, wherein the topcoat layer is of a composition comprising a resin binder, a photoactive compound that undergoes photolysis upon exposure to activating radiation to generate an acid or a base and a crosslinking agent, said resin binder consisting essentially of an acrylic copolymer formed from a mixture of acrylic monomers where at least one acrylic monomer has carboxylic acid substitution and another acrylic monomer has hydroxyl substitution.

2. The color filter assembly of claim 1 wherein the acrylic resin copolymer has pendant carboxylic acid groups.

3. The color filter assembly of claim 1 wherein the crosslinking agent is an amine containing crosslinking agent.

4. The color filter assembly of claim 3 wherein the crosslinking agent is a member selected from the group consisting of a melamine and a benzoguanidine formaldehyde resin.

5. The color filter assembly of claim 1 wherein the topcoat composition is developable in aqueous solution.

6. The color filter assembly of claim 1 wherein the transparent substrate is glass.

7. The color filter assembly of claim 1 wherein one of the monomers used to form the acrylic copolymer is a member selected from the group consisting of hydroxyethyl methacrylate, methacrylic acid and mixtures thereof.

8. The color filter assembly of claim 7 wherein the monomer is hydroxyethyl methacrylate.

9. The color filter assembly of claim 1 wherein the color filter array is formed from a composition comprising a resin binder consisting of an acrylic copolymer having acidic or hydroxyl group substitution, a dye or pigment, a photoactive compound that undergoes photolysis upon exposure to activating radiation to generate an acid or a base and a thermal crosslinking agent.

10. The color filter assembly of claim 9 wherein the acrylic copolymer from which the color filter array is formed has pendant carboxylic acid groups.

11. The color filter assembly of claim 9 wherein one of the monomers used to form the acrylic copolymer of the topcoat is a member selected from the group consisting of hydroxyethyl methacrylate, methacrylic acid and mixtures thereof.

12. The color filter assembly of claim 11 wherein the monomer is hydroxyethyl methacrylate.

13. The color filter assembly of claim 10 wherein the acrylic copolymer from which the color filter array is formed is developable in aqueous solution.

14. The color filter of claim 9 wherein the crosslinking agent from which the color filter array is formed is an amine containing crosslinking agent.

15. The color filter assembly of claim 14 wherein the crosslinking agent from which the color filter array is formed is a melamine.

* * * * *